(12) United States Patent
Choi et al.

(10) Patent No.: US 12,176,290 B2
(45) Date of Patent: Dec. 24, 2024

(54) SEMICONDUCTOR DEVICE

(71) Applicant: SAMSUNG ELECTRONICS CO., LTD., Suwon-si (KR)

(72) Inventors: Sungyu Choi, Namyangju-si (KR);
Seongheum Choi, Hwaseong-si (KR);
Daeyong Kim, Yongin-si (KR);
Rakhwan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 583 days.

(21) Appl. No.: 17/451,725

(22) Filed: Oct. 21, 2021

(65) Prior Publication Data
US 2022/0246528 A1 Aug. 4, 2022

(30) Foreign Application Priority Data

Feb. 2, 2021 (KR) .................. 10-2021-0014664

(51) Int. Cl.
*H01L 23/535* (2006.01)
*H01L 21/285* (2006.01)
(Continued)

(52) U.S. Cl.
CPC ...... *H01L 23/535* (2013.01); *H01L 21/28518* (2013.01); *H01L 21/76805* (2013.01); *H01L 21/76846* (2013.01); *H01L 21/76895* (2013.01); *H01L 23/53252* (2013.01); *H01L 23/53266* (2013.01); *H01L 29/0847* (2013.01);
(Continued)

(58) Field of Classification Search
CPC ............ H01L 23/535; H01L 21/28518; H01L 21/76805; H01L 21/76846; H01L 21/76895; H01L 23/53252; H01L 23/53266; H01L 29/0847; H01L 29/41791;
(Continued)

(56) References Cited

U.S. PATENT DOCUMENTS 6,245,668 B1 6/2001 Brodsky et al.
2003/0073304 A1 4/2003 Mak et al.
(Continued)

FOREIGN PATENT DOCUMENTS

JP H06-163705 6/1994
KR 10-1998-0005524 3/1998
(Continued)

*Primary Examiner* — Bo B Jang
(74) *Attorney, Agent, or Firm* — F. CHAU & ASSOCIATES, LLC

(57) ABSTRACT

A semiconductor device includes an active region extending in a first direction on a substrate; a gate structure extending in a second direction on the substrate, intersecting the active region, and including a gate electrode, source/drain region disposed on the active region on at least one side of the gate structure, a first contact structure connected to the source/drain region; a first gate contact structure disposed on and connected to the gate electrode; a second contact structure disposed on and connected to the first contact structure; and a second gate contact structure disposed on and connected to the first gate contact structure. The second contact structure and/or the second gate contact structure may include an upper metal layer and a metal liner covering a lower surface and side surfaces of the upper metal layer. An external surface of the metal liner may have surface roughness.

20 Claims, 14 Drawing Sheets

(51) Int. Cl.
  *H01L 21/768* (2006.01)
  *H01L 23/532* (2006.01)
  *H01L 29/08* (2006.01)
  *H01L 29/417* (2006.01)
  *H01L 29/45* (2006.01)
  *H01L 29/66* (2006.01)
  *H01L 29/78* (2006.01)

(52) U.S. Cl.
  CPC ........ *H01L 29/41791* (2013.01); *H01L 29/45* (2013.01); *H01L 29/66795* (2013.01); *H01L 29/7851* (2013.01)

(58) Field of Classification Search
  CPC  H01L 29/45; H01L 29/66795; H01L 29/7851
  See application file for complete search history.

(56) References Cited

U.S. PATENT DOCUMENTS

| | | | |
|---|---|---|---|
| 2003/0209738 A1* | 11/2003 | Ohto | H01L 23/53238 |
| | | | 257/E21.585 |
| 2004/0229462 A1* | 11/2004 | Gracias | H01L 21/7684 |
| | | | 438/692 |
| 2015/0041854 A1 | 2/2015 | Wang et al. | |
| 2018/0047620 A1* | 2/2018 | Noguchi | H01L 21/76843 |
| 2018/0144978 A1 | 5/2018 | Lin et al. | |

FOREIGN PATENT DOCUMENTS

| | | |
|---|---|---|
| KR | 10-2000-0022723 | 4/2000 |
| KR | 10-2005-0012580 | 2/2005 |
| KR | 10-2006-0011551 | 2/2006 |
| KR | 10-2008-0101745 | 11/2008 |
| KR | 10-2013-0100157 | 9/2013 |

* cited by examiner

SEMICONDUCTOR DEVICE

CROSS-REFERENCE TO RELATED APPLICATION(S)

This application claims priority under 35 U.S.C. § 119 to Korean Patent Application No. 10-2021-0014664, filed on Feb. 2, 2021, in the Korean Intellectual Property Office, the disclosure of which is incorporated by reference herein in its entirety.

TECHNICAL FIELD

The present inventive concept relates to a semiconductor device.

DISCUSSION OF RELATED ART

Recently, the degree of integration of semiconductor devices has increased in accordance with increasing demand for high performance, high speed, and/or multifunctionality in the semiconductor devices. As the semiconductor devices have higher degree of integration, a size of transistors included in the semiconductor devices has decreased accordingly. Although a size of wirings electrically connected to the transistors also decreases, it may be difficult to implement a high-speed operation due to an increase in resistance of the wirings and an increase in capacitance between the wirings.

SUMMARY

The present inventive concept provides a semiconductor device, which has enhanced electrical characteristics.

According to an example embodiment of the present inventive concept, a semiconductor device includes: an active region extending in a first direction on a substrate; a gate structure extending in a second direction on the substrate, intersecting the active region, and including a gate electrode; source/drain region disposed on the active region on at least one side of the gate structure; a first contact structure connected to the source/drain region on the at least one side of the gate structure; a first gate contact structure disposed on the gate electrode and connected to the gate electrode; a second contact structure disposed on the first contact structure and connected to the first contact structure; and a second gate contact structure disposed on the first gate contact structure and connected to the first gate contact structure, in which at least one of the second contact structure or the second gate contact structure includes an upper metal layer and a metal liner covering a lower surface and side surfaces of the upper metal layer, and an external surface of the metal liner has surface roughness.

According to an example embodiment of the present inventive concept, a semiconductor device includes: an active region extending in a first direction on a substrate; a gate structure intersecting the active region on the substrate and extending in a second direction; source/drain region disposed on the active region on at least one side of the gate structure; a first contact structure connected to the source/drain region on the at least one side of the gate structure; and a second contact structure disposed on the first contact structure and connected to the first contact structure, in which the second contact structure includes a first upper metal layer and a first metal liner covering a lower surface and side surfaces of the first upper metal layer, and an external surface of the first metal liner includes a plurality of uneven portions.

According to an example embodiment of the present inventive concept, a semiconductor device includes: a first interlayer insulating layer and a second interlayer insulating layer sequentially disposed on a substrate; a first contact structure penetrating the first interlayer insulating layer on the substrate; a second contact structure penetrating the second interlayer insulating layer and contacting an upper portion of the first contact structure; and a metal wiring contacting an upper portion of the second contact structure and extending in a first direction, in which the first contact structure includes a metal plug layer and a barrier layer covering a lower surface and side surfaces of the metal plug layer, the second contact structure includes an upper metal layer and a metal liner covering a lower surface and side surfaces of the upper metal layer, and a side surface of the second interlayer insulating layer in contact with the metal liner has surface roughness.

BRIEF DESCRIPTION OF THE DRAWINGS

The above and other aspects and features of the present inventive concept will be more clearly understood from the following detailed description, taken in conjunction with the accompanying drawings, in which.

Figure 1:
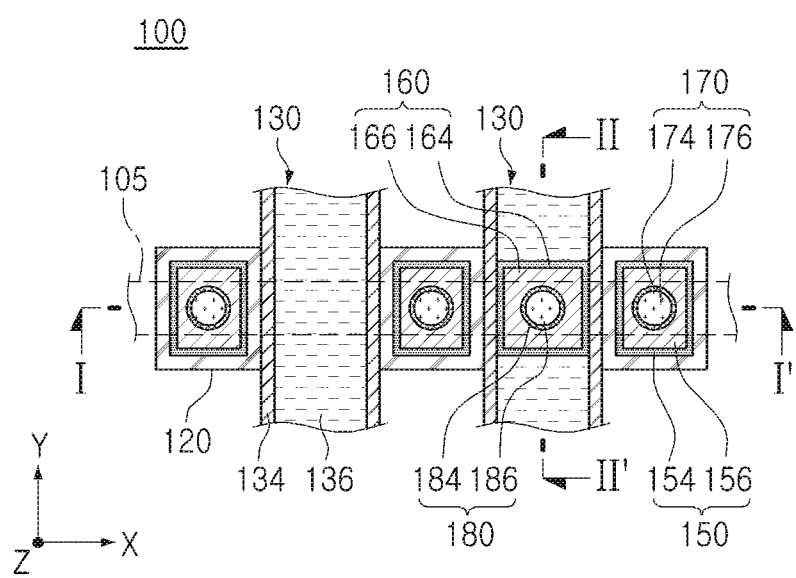
FIG. 1 is a plan view illustrating a semiconductor device according to an example embodiment of the present inventive concept.

Since the drawings in FIGS. 1-15 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, example embodiments of the present inventive concept will be described with reference to the accompanying drawings.

FIG. 1 is a plan view illustrating a semiconductor device according to an example embodiment of the present inventive concept.

Figure 2:
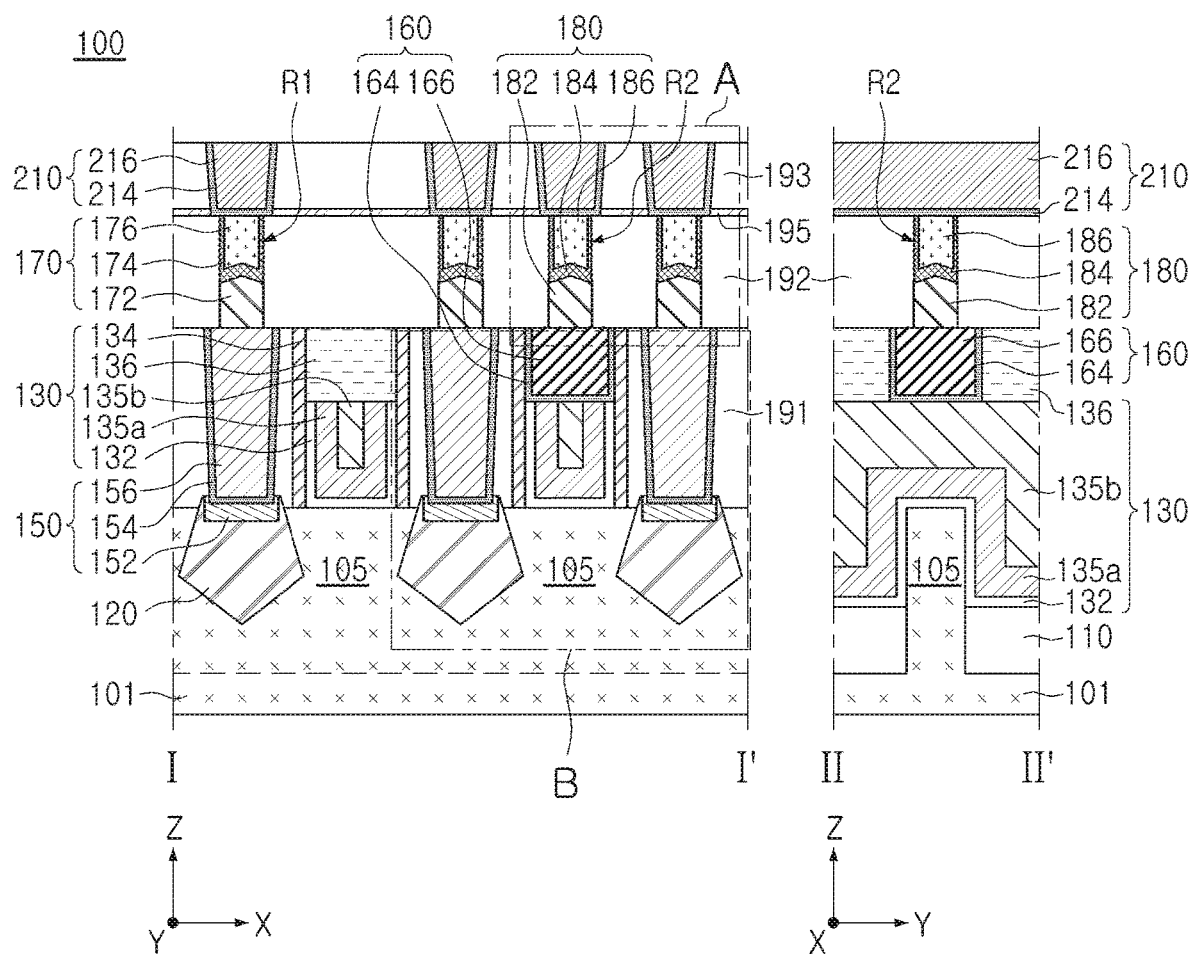
FIG. 2 is a cross-sectional view illustrating a semiconductor device according to an example embodiment of the present inventive concept.

FIG. 2 is a cross-sectional view illustrating a semiconductor device according to an example embodiment of the present inventive concept. FIG. 2 is cross-sectional views of the semiconductor device of FIG. 1 taken along lines I-I' and II-II'. For convenience of description, only major components of a semiconductor device are illustrated in FIGS. 1 and 2.

Figure 3:
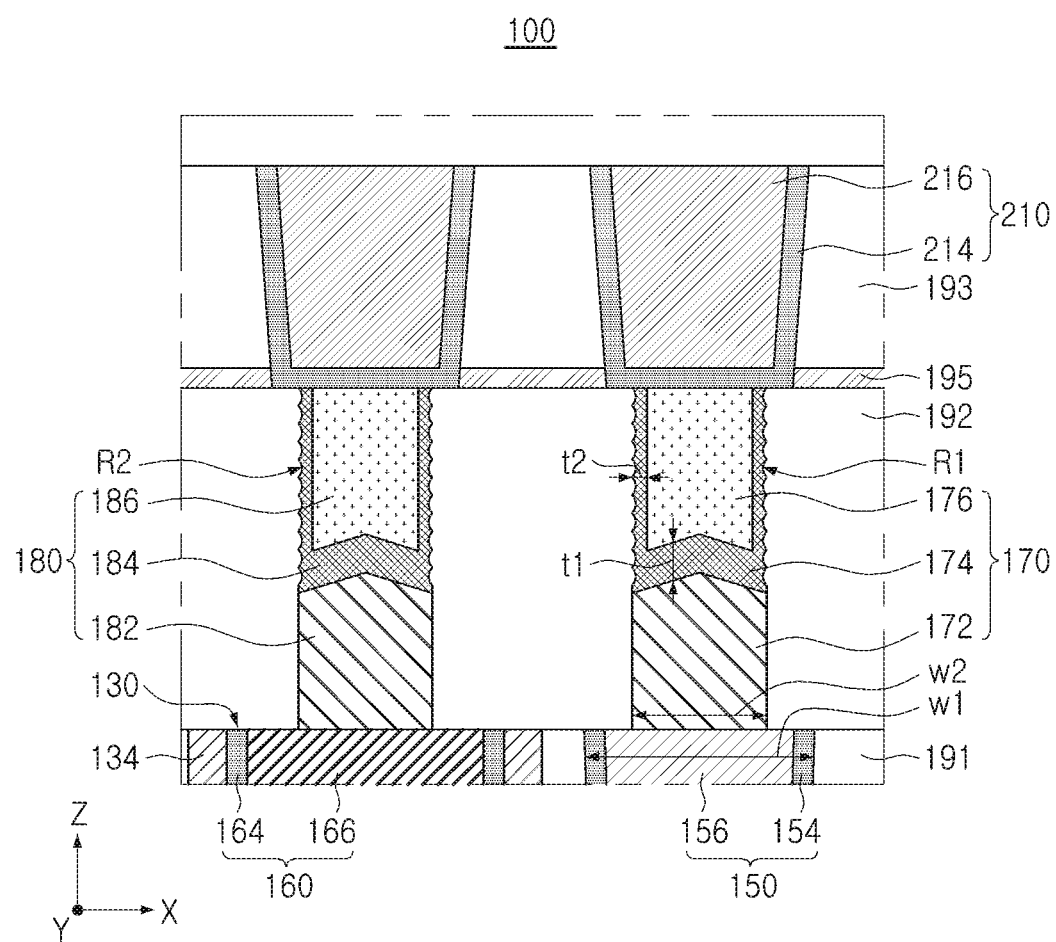
FIG. 3 is a partially enlarged cross-sectional view illustrating a semiconductor device according to an example embodiment of the present inventive concept.

FIG. 3 is a partially enlarged cross-sectional view illustrating a semiconductor device according to an example embodiment of the present inventive concept. FIG. 3 is an enlarged view of region "A" of the semiconductor device of FIG. 2.

Referring to FIGS. 1 through 3, a semiconductor device 100 may include a substrate 101, an active region 105 on the substrate 101, a gate structure 130 extending by intersecting the active region 105, source/drain regions 120 on the active region 105 on both sides of the gate structure 130, a first contact structure 150 connected to the source/drain regions 120, a second contact structure 170 connected to the first contact structure 150, a first gate contact structure 160 connected to gate electrodes 135a and 135b of the gate structure 130, and a second gate contact structure 180 connected to the first gate contact structure. The semiconductor device 100 may further include a device isolation layer 110, interlayer insulating layers 191, 192, and 193, an etch stop layer 195, and upper wiring layers 210.

The semiconductor device 100 may include a fin field effect transistor (FinFET), a transistor in which the active region 105 has a fin structure and a channel region of the transistor is formed in the active region 105 intersecting a gate electrode 135. For example, the channel region may be formed in a portion of the active region 105 at a location where the gate electrode 135 covers the upper surface and both side walls of the active region 105. However, the present inventive concept is not limited thereto and the semiconductor device 100 may include a multi-bridge channel FET (MBCFET™) or gate-all-around (GAA) transistor including a plurality of channel layers stacked apart on the active region 105 and partially surrounded by the gate electrode 135.

The substrate 101 may include a semiconductor material, such as a group IV semiconductor, a group III-V compound semiconductor, or a group II-VI compound semiconductor. For example, the group IV semiconductor may include, for example, silicon (Si), germanium (Ge), or silicon germanium (SiGe). For example, compound semiconductor may include, for example, gallium phosphide (GaP), gallium arsenide (GaAs), Gallium Antimonide (GaSb), indium phosphide (InP), indium arsenide (InAs), indium antimonide (InSb), indium gallium arsenide (InGaAs), etc. The substrate 101 may be provided as, for example, a bulk wafer, an epitaxial layer, a silicon on insulator (SOI) layer, a semiconductor on insulator (SeOI) layer, or the like.

The active region 105 may be defined by the device isolation layer 110 in the substrate 101 and may be disposed to extend in a first direction, for example, in an X direction. The active region 105 may have a structure protruding from the substrate 101. An upper end of the active region 105 may be disposed to protrude from an upper surface of the device isolation layer 110 to a predetermined height. The active region 105 may be formed as part of the substrate 101 or may include an epitaxial layer grown from the substrate 101. However, on both sides of the gate structure 130, the active region 105 on the substrate 101 is partially recessed, and the source/drain regions 120 may be disposed on the recessed active region 105. For example, the source/drain region 120 may be disposed on the active region 105 on at least one side of the gate structure 130. Accordingly, as illustrated in FIG. 2, the active region 105 below the gate structure 130 may have a relatively high height. According to an example embodiment of the present inventive concept, the active region 105 may include impurities or doped regions including impurities, and at least some of the active regions 105 may include impurities having different conductivity types, but the present inventive concept is not limited thereto. The channel region of the active region 105 may or may not include impurities. The active region 105 may be provided in plurality, and the plurality of active regions 105 may be spaced apart from each other in a Y direction.

The device isolation layer 110 may define the active region 105 in the substrate 101, and may be formed by, for example, a shallow trench isolation (STI) process. The device isolation layer 110 may expose upper sidewalls of the active region 105. According to an example embodiment of the present inventive concept, the device isolation layer 110 may include a region extending deeper to a lower portion of the substrate 101 between the active regions 105. The device isolation layer 110 may have a curved upper surface having a higher level in a direction toward the active region 105, but a shape of the upper surface of the device isolation layer 110 is not limited thereto. The device isolation layer 110 may be formed of an insulating material such as, for example, an oxide, a nitride, or a combination thereof.

The source/drain regions 120 may be disposed on the active region 105 on both sides of the gate structure 130, and may be provided as a source region or a drain region of a transistor. The source/drain regions 120 may be disposed by partially recessing an upper portion of the active region 105, but the present inventive concept is not limited thereto. For example, whether to recess and a depth of the recess for the source/drain regions 120 may be variously changed. The source/drain regions 120 may be a semiconductor layer including silicon (Si) and may be formed of an epitaxial layer. The source/drain regions 120 may include impurities having different types and/or different concentrations. For example, the source/drain regions 120 may include n-type doped silicon (Si) and/or p-type doped silicon germanium (SiGe). In an example embodiment of the present inventive concept, the source/drain regions 120 may include a plurality of regions including elements having different concentrations and/or different doping elements. In an example embodiment of the present inventive concept, the source/drain regions 120 may have a merged shape connected to each other between the active regions 105 adjacent to each other in the Y direction, but the present inventive concept is not limited thereto.

The gate structure 130 may be disposed to intersect the active region 105 above the active region 105 and extend in one direction, for example, in the Y direction. A plurality of gate structures 130 may be disposed to be spaced apart from each other in the X direction. Channel regions of transistors may be formed in the active region 105 intersecting the gate structures 130. The gate structure 130 may include gate electrodes 135a and 135b, a gate dielectric layer 132 between the gate electrodes 135a and 135b and the active region 105, spacer layers 134 on side surfaces of the gate electrodes 135a and 135b, and a gate capping layer 136 on upper surfaces of the gate electrodes 135a and 135b.

The gate dielectric layer 132 may be disposed between the active region 105 and the gate electrodes 135a and 135b, and may be disposed to cover at least portions of the surfaces of the gate electrodes 135a and 135b. For example, the gate dielectric layer 132 may be disposed to surround all surfaces of the gate electrodes 135a and 135b except for a top surface. The top surface of the gate electrodes 135a and 135b may be covered by the gate capping layer 136. The gate dielectric layer 132 may extend between the gate electrodes 135a and 135b and the spacer layers 134, but the present inventive is not limited thereto. The gate dielectric layer 132 may include, for example, an oxide, a nitride, or a high-k material. The high-k material may refer to a dielectric material having a dielectric constant higher than that of a silicon oxide film ($SiO_2$). The high-k material may be any one of, for example, aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), barium strontium titanium oxide ($BaSr_xTi_yO_z$), barium titanium oxide ($BaTi_xO_y$), strontium titanium oxide ($SrTi_xO_y$), praseodymium oxide ($Pr_2O_3$), and a combination thereof.

The gate electrodes 135a and 135b may be disposed on the active region 105, and may be spaced apart from the active region 105 by the gate dielectric layer 132. The gate electrodes 135a and 135b may include a conductive material. The gate electrodes 135a and 135b may include a first gate conductive layer 135a and a second gate conductive layer 135b. The first gate conductive layer 135a may serve as an antidiffusion layer for the second gate conductive layer 135b, but the present inventive concept is not limited thereto. The first gate conductive layer 135a may include a metal nitride such as, for example, titanium nitride (TiN), tantalum nitride (TaN), or tungsten nitride (WN). The second gate conductive layer 135b may include a metal such as, for example, aluminum (Al), tungsten (W), or molybdenum (Mo). The gate electrodes 135a and 135b may include a semiconductor material such as doped polysilicon (p-Si).

The spacer layers 134 may be disposed on both side surfaces of the gate electrodes 135a and 135b and may extend in a Z direction perpendicular to an upper surface of the substrate 101. In an example embodiment of the present inventive concept, the spacer layers 134 may include a curved external surface so that a width of an upper portion of each of the spacer layers 134 is smaller than a width of a lower portion thereof. The spacer layers 134 may insulate the source/drain regions 120 and the gate electrodes 135a and 135b. The spacer layers 134 may have a multilayer structure according to an example embodiment of the present inventive concept. The spacer layers 134 may be formed of, for example, oxide, nitride, and/or oxynitride, and in particular, may be formed of a low-k film.

The gate capping layer 136 may be disposed on the gate electrodes 135a and 135b. The gate capping layer 136 may be disposed to extend in the second direction, for example, the Y direction along upper surfaces of the gate electrodes 135a and 135b. Side surfaces of the gate capping layer 136 may be surrounded by the spacer layers 134. Although FIG. 2 illustrates that the gate dielectric layer 132 does not extend between the spacer layers 134 and the gate capping layer 136, the present inventive concept is not limited thereto. An upper surface of the gate capping layer 136 may be substantially coplanar with the upper surfaces of the spacer layers 134, but the present inventive concept is not limited thereto. The gate capping layer 136 may be formed of oxide, nitride, and/or oxynitride, and for example, may include at least one of silicon oxide ($SiO_2$), silicon nitride ($Si_3N_4$), silicon carbonitride (SiCN), silicon oxycarbide (SiOC), silicon oxynitride (SiON), or silicon oxycarbonitride (SiOCN).

The first contact structure 150 may penetrate the first interlayer insulating layer 191 between the gate structures 130 in a vertical direction, for example, in the Z direction. The first contact structure 150 may be surrounded by the first interlayer insulating layer 191 to be insulated from other conductive elements. The first contact structure 150 may be connected to the source/drain regions 120, and may apply an electric signal to the source/drain regions 120. The first contact structure 150 may be disposed on the source/drain regions 120, and according to an example embodiment of the present inventive concept, the first contact structure 150 may be disposed to have a length greater than the source/drain regions 120 in the Y direction. In an example embodiment of the present inventive concept, different from that illustrated in FIG. 1, the source/drain regions 120 may have a merged shape connected to each other between a plurality of active regions 105 adjacent to each other in the Y direction, and first contact structure 150 may have a bar shape extending in the Y direction to overlap the plurality of active regions 105. The first contact structure 150 may have an inclined side surface in which a width of a lower portion thereof is narrower than a width of an upper portion thereof according to the aspect ratio, but the present inventive concept is not limited thereto. The first contact structure 150 may include a metal-semiconductor layer 152 disposed in a recess region of the source/drain region 120, a first metal plug layer 156 on the metal-semiconductor layer 152, and a first barrier layer 154 covering a lower surface and side surfaces of the first metal plug layer 156. As illustrated in FIG. 2, the recess may have a relatively flat lower surface, but the present inventive concept is not limited thereto. The first barrier layer 154 and the first metal plug layer 156 may form "contact plug" 154 and 156.

The first contact structure 150 may include the metal-semiconductor layer 152 disposed in the recess region of the source/drain region 120 and the contact plug 154 and 156 disposed on the metal-semiconductor layer 152, in which the contact plug 154 and 156 includes the first barrier layer 154 and the first metal plug layer 156. The metal-semiconductor layer 152 may include, for example, a metal silicide, a metal germanide, or a metal silicide-germanide, and may reduce contact resistance with the source/drain region 120. In the metal-semiconductor layer 152, the metal may be titanium (Ti), nickel (Ni), tantalum (Ta), cobalt (Co), and/or tungsten (W), and the semiconductor may be silicon (Si), germanium (Ge), or silicon germanium (SiGe). For example, the metal-semiconductor layer 152 may include at least one of cobalt silicide ($CoSi_2$), titanium silicide ($TiSi_2$), nickel silicide ($NiSi_2$), or tungsten silicide ($WSi_2$).

The first barrier layer 154 may surround a lower surface and side surfaces of the first metal plug layer 156, and may directly contact the metal-semiconductor layer 152. The first barrier layer 154 may conformally cover an inner wall of a contact hole. The first barrier layer 154 may include at least one of a metal nitride, for example, titanium nitride (TiN), tantalum nitride (TaN), or tungsten nitride (WN). However, according to an example embodiment of the present inventive concept, the first barrier layer 154 may be omitted.

The first metal plug layer 156 may be disposed to fill a space between inner walls of the first barrier layer 154. The first metal plug layer 156 may include a metal, for example, at least one of aluminum (Al), copper (Cu), tungsten (W), cobalt (Co), ruthenium (Ru), or molybdenum (Mo).

The first gate contact structure 160 may be connected to the gate electrodes 135a and 135b and penetrating through the gate capping layer 136 in a vertical direction, for example, in the Z direction. The first gate contact structure 160 may be disposed on the gate electrodes 135a and 135b, and may include a second metal plug layer 166 and a second barrier layer 164 covering a lower surface and side surfaces of the second metal plug layer 166. The second barrier layer 164 and the second metal plug layer 166 may form "gate contact plug" 164 and 166. The second metal plug layer 166 may be referred to as a "gate metal plug layer".

The second barrier layer 164 may surround a lower surface and side surfaces of the second metal plug layer 166, and may directly contact the gate electrodes 135a and 135b. The second barrier layer 164 may conformally cover an inner wall of a gate contact hole. The second barrier layer 164 may include a metal nitride, for example, at least one of titanium nitride (TiN), tantalum nitride (TaN), or tungsten nitride (WN).

The second metal plug layer 166 may be disposed to fill a space between inner walls of the second barrier layer 164. The second metal plug layer 166 may include a metal, for example, at least one of aluminum (Al), copper (Cu), tungsten (W), cobalt (Co), ruthenium (Ru), or molybdenum (Mo).

The second contact structure 170 may be disposed on the first contact structure 150 and connected to the first contact structure 150. The second contact structure 170 may penetrate the second interlayer insulating layer 192 in a vertical direction, for example, in the Z direction. The second contact structure 170 may be a via connecting the first contact structure 150 to the upper wiring layer 210. As illustrated in FIG. 1, based on the X-Y plane, a cross section of the second contact structure 170 employed in this example embodiment may have a circular hole shape. However, the present inventive concept is not limited thereto, and for example, in an example embodiment of the present inventive concept, the cross section of the second contact structure 170 based on the X-Y plane may have, for example, an oval, or polygonal shape. The second contact structure 170 may include a first lower metal layer 172, a first upper metal layer 176 on the first lower metal layer 172, and a first metal liner 174 covering a lower surface and side surfaces of the first upper metal layer 176.

The first lower metal layer 172 may be disposed to fill at least a portion of a lower portion of a via hole, and may be disposed below the first upper metal layer 176. The first lower metal layer 172 may be disposed between the first metal liner 174 and the first contact structure 150. The first lower metal layer 172 may have a second width w2 in the X direction smaller than a first width w1 in the X direction of an upper region of the first contact structure 150. The second width w2 may be the width of a lower region of the second contact structure 170. The center of an upper surface of the first lower metal layer 172 may have a region protruding toward the first upper metal layer 176. For example, the upper surface of the first lower metal layer 172 may have a convex shape or an inverted V shape, but the present inventive concept is not limited thereto.

The first lower metal layer 172 may be formed using a selective deposition process. For example, the first lower metal layer 172 may be selectively formed on the first metal plug layer 156 of the first contact structure 150 disposed below the via hole and may not be formed on the second interlayer insulating layer 192. The selective deposition process may be a bottom-up approach with area-selective deposition of the first lower metal layer 172 in the via hole, and thus may reduce the number of lithography and etch steps in the manufacturing flow. The first lower metal layer 172 may include a metal, for example, at least one of aluminum (Al), copper (Cu), tungsten (W), cobalt (Co), ruthenium (Ru), or molybdenum (Mo). For example, when the first lower metal layer 172 includes tungsten (W), a tungsten layer may be formed of a single crystal layer. In an example embodiment of the present inventive concept, the selective deposition process for the first lower metal layer 172 may be a selective tungsten (W) process, and the selective tungsten (W) formed may be a single crystalline tungsten (W) layer.

The first metal liner 174 may be disposed to cover an upper surface of the first lower metal layer 172 and an inner wall of the via hole. The first metal liner 174 may directly contact the first lower metal layer 172 and the first upper metal layer 176. An external surface of the first metal liner 174 may include a plurality of uneven portions R1. The first metal liner 174 may have surface roughness due to the plurality of uneven portions R1. The plurality of uneven portions R1 or the surface roughness may be formed by re-sputtering during a physical vapor deposition (PVD) process. Adhesion between the first metal liner 174 and the second interlayer insulating layer 192 may be enhanced by the plurality of uneven portions R1 or the surface roughness.

The first metal liner 174 may include a metal, for example, at least one of aluminum (Al), copper (Cu), tungsten (W), cobalt (Co), ruthenium (Ru), or molybdenum (Mo). For example, when the first metal liner 174 includes tungsten (W), a tungsten layer may be formed of polycrystalline layer. In an example embodiment of the present inventive concept, the re-sputtering PVD process for the first metal liner 174 may be a PVD tungsten (W) process, and the PVD tungsten (W) formed may be a polycrystalline tungsten (W) layer. Crystallinity of the first metal liner 174 and crystallinity of the first lower metal layer 172 may be classified by a Transmission Kikuchi Diffraction (TKD) analysis. The first metal liner 174 may replace a barrier metal layer (Ti/TiN) having high resistance, thus resistance of the second contact structure 170 may be reduced.

When the first upper metal layer 176 is formed using a chemical vapor deposition (CVD) process, the first metal liner 174 may act as a barrier preventing diffusion of fluorine (F) element. Meanwhile, since the first metal liner 174 is formed by PVD unlike the first upper metal layer 176, the first metal liner 174 may include fluorine (F) element concentration smaller than fluorine (F) element concentration of the first upper metal layer 176. For example, when the first upper metal layer 176 is formed of tungsten (W), tungsten fluoride ($WF_6$) may be used to form tungsten (W) film through the CVD process, and thus the first upper metal layer 176 may have relatively higher fluorine (F) concentration. For example, when the first metal liner 174 is formed of tungsten (W), a tungsten (W) target may be used to form tungsten (W) film through the PVD process, and thus the first metal liner 174 may have no fluorine (F) concentration or very low fluorine (F) concentration.

The first metal liner 174 may have a first thickness t1 in the vertical direction, for example, in the Z direction, below the first upper metal layer 176 and a second thickness t2 in the horizontal direction, for example, in the X direction, on a side surface of the first upper metal layer 176, and the second thickness t2 may be a maximum thickness of the first metal liner 174 in the horizontal direction X. The first thickness t1 may be greater than the second thickness t2.

The first upper metal layer 176 may be disposed on the first metal liner 174, and may be disposed to fill a space between inner walls of the first metal liner 174. A lower surface of the first upper metal layer 176 may include a concave recess region, but the present inventive concept is not limited thereto. The first upper metal layer 176 may include a metal, for example, at least one of tungsten (W), ruthenium (Ru), or molybdenum (Mo). In an example embodiment of the present inventive concept, to obtain a contact plug structure having low resistance, the second contact structure 170 may include the first lower metal layer 172 formed of selective tungsten (W), the first metal liner 174 formed of PVD tungsten (W), and the first upper metal layer 176 formed of, at least one of tungsten (W), ruthenium (Ru), or molybdenum (Mo) through a CVD process. For example, the first upper metal layer 176 may be formed of a single metal structure including any one of tungsten (W), ruthenium (Ru), and molybdenum (Mo), a dual metal structure including any two of tungsten (W), ruthenium (Ru), and molybdenum (Mo), or a triple metal structure including all of tungsten (W), ruthenium (Ru), and molybdenum (Mo). For example, when using PVD tungsten (W) as the first metal liner 174, it is possible to reduce resistance by applying different metals with metals such as molybdenum (Mo) and ruthenium (Ru) to the first upper metal layer 176.

The second gate contact structure 180 may be disposed on the first gate contact structure 160 and connected to the first gate contact structure 160. The second gate contact structure 180 may penetrate the second interlayer insulating layer 192 in a vertical direction, for example, in the Z direction. The second gate contact structure 180 may be a via connecting the first gate contact structure 160 to the upper wiring layer 210. As illustrated in FIG. 1, based on the X-Y plane, a cross section of the second gate contact structure 180 employed in this example embodiment may have a circular hole shape. However, the present inventive concept is not limited thereto, and for example, in an example embodiment of the present inventive concept, the cross section of the second gate contact structure 180 based on the X-Y plane may have, for example, an oval, or polygonal shape. The second gate contact structure 180 may include a second lower metal layer 182, a second upper metal layer 186 on the second lower metal layer 182, and a second metal liner 184 covering a lower surface and side surfaces of the second upper metal layer 186.

The second lower metal layer 182 may be disposed to fill at least a portion of a lower portion of the via hole. The second lower metal layer 182 may be disposed below the second upper metal layer 186, and may be disposed between the second metal liner 184 and the first gate contact structure 160.

Like the first lower metal layer 172, the second lower metal layer 182 may be formed using a selective deposition process. The second lower metal layer 182 may include a material the same as that of the first lower metal layer 172, for example, at least one of aluminum (Al), copper (Cu), tungsten (W), cobalt (Co), ruthenium (Ru), or molybdenum (Mo). For example, when the first lower metal layer 172 includes tungsten (W), the tungsten layer may be formed of a single crystal layer.

The second metal liner 184 may be disposed to cover an upper surface of the second lower metal layer 182 and an inner wall of the via hole. Like the first metal liner 174, an external surface of the second metal liner 184 may include a plurality of uneven portions R2. The second metal liner 184 may have surface roughness due to the plurality of uneven portions R2. Adhesion between the second metal liner 184 and the second interlayer insulating layer 192 may be enhanced by the plurality of uneven portions R2 or the surface roughness. Description thereof is the same as the description of the first metal liner 174, and thus omitted. Similarly, the second metal liner 184 may replace a barrier metal layer (Ti/TiN) having high resistance, thereby resistance of the second gate contact structure 180 may be reduced.

The second upper metal layer 186 may be disposed on the second metal liner 184, and may be disposed to fill a space between inner walls of the second metal liner 184. The second upper metal layer 186 may include a material the same as that of the first upper metal layer 176, for example, at least one of tungsten (W), ruthenium (Ru), or molybdenum (Mo). For example, the second upper metal layer 186 may be formed by performing a CVD process. During the CVD process, the second metal liner 184 may prevent diffusion of fluorine (F) element.

The interlayer insulating layers 191, 192, and 193 may include a first interlayer insulating layer 191, a second interlayer insulating layer 192, and a third interlayer insulating layer 193 which are sequentially disposed on the substrate 101. The first interlayer insulating layer 191 may be disposed to cover the source/drain regions 120, side surfaces of the gate structure 130, and side surfaces of the first contact structure 150. The second interlayer insulating layer 192 may be disposed on the gate structures 130. A surface of the second interlayer insulating layer 192 in contact with the first metal liner 174 may have surface roughness. Adhesion between the first metal liner 174 and the second interlayer insulating layer 192 may be enhanced by the surface roughness. A surface of the second interlayer insulating layer 192 in contact with the second metal liner 184 may have surface roughness. Adhesion between the second metal liner 184 and the second interlayer insulating layer 192 may be enhanced by the surface roughness. The third interlayer insulating layer 193 may be an insulating layer in a region in which the upper wiring layer 210 is disposed. The interlayer insulating layers 191, 192, and 193 may each include, for example, at least one of oxide, nitride, and/or oxynitride, and may include a low-k material. The interlayer insulating layers 191, 192, and 193 each including a low-k material may include, for example, a silicon oxide ($SiO_2$) layer, a silicon oxynitride (SiON) layer, a silicon oxycarbide (SiOC) layer, a hydrogenated silicon oxycarbide (SiCOH) layer, or a combination thereof.

The etch stop layer 195 may be disposed between the second interlayer insulating layer 192 and the third interlayer insulating layer 193. The etch stop layer 195 may include a material having etch selectivity with respect to the interlayer insulating layers 191, 192, and 193. The etch stop layer 195 may include, for example, aluminum oxide ($Al_2O_3$), aluminum nitride (AlN), aluminum oxynitride (AlON), or a combination thereof. In addition to aluminum (Al), the etch stop layer 195 may further include at least one of titanium (Ti), tantalum (Ta), cobalt (Co), zirconium (Zr), ruthenium (Ru), lanthanum (La), or hafnium (Hf).

The upper wiring layers 210 may be disposed on the second contact structure 170 and the second gate contact structure 180, respectively. The upper wiring layer 210 may have a line shape extending in the Y direction, for example. The upper wiring layer 210 may include a metal layer 216 and a barrier layer 214 covering a lower surface and side surfaces of the metal layer 216. The barrier layer 214 may include a metal nitride, for example, at least one of titanium nitride (TiN), tantalum nitride (TaN), or tungsten nitride (WN). The metal layer 216 may include a metal, for example, at least one of aluminum (Al), copper (Cu), tungsten (W), cobalt (Co), ruthenium (Ru), or molybdenum (Mo).

A description of the first contact structure 150 of the present inventive concept may be equally applied to a contact structure in a volatile memory device such as a dynamic RAM (DRAM) or a static RAM (SRAM), or a nonvolatile memory device such as a phase change RAM (PRAM), a magnetic RAM (MRAM), a resistive RAM (RRAM), or a flash memory. For example, in a NAND flash memory device, contact plugs connected to stepped gate electrodes may have a structure the same as that of the first contact structure 150 of the present inventive concept.

Figure 4:
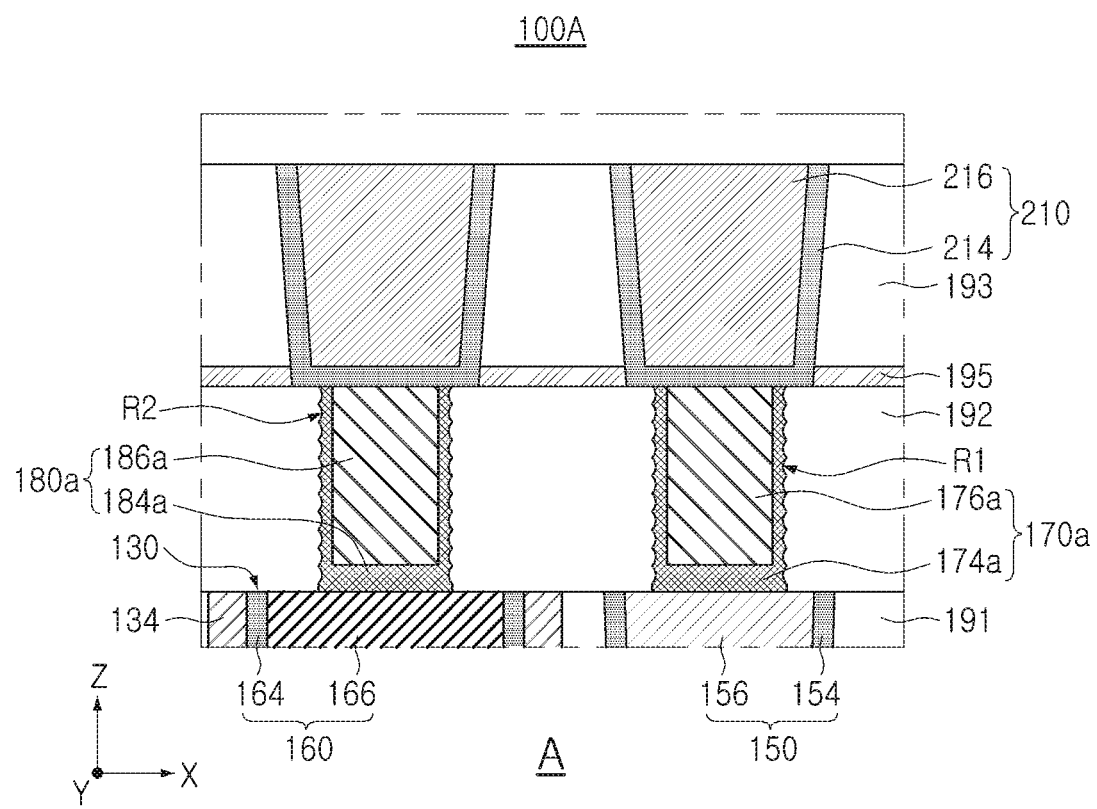
FIG. 4 is a partially enlarged cross-sectional view illustrating a semiconductor device according to an example embodiment of the present inventive concept.

FIG. 4 is a partially enlarged cross-sectional view illustrating a semiconductor device according to an example embodiment of the present inventive concept. FIG. 4 illustrates a region corresponding to region "A" of FIG. 2.

Referring to FIG. 4, in a semiconductor device 100A, a second contact structure 170a may include a first metal liner 174a and a first metal layer 176a, the first metal liner 174a may be formed by performing a PVD process, and the first metal layer 176a may be selectively formed on the first metal liner 174a by performing a selective deposition process like the first lower metal layer 172 of FIG. 3. A second gate contact structure 180a may include a second metal liner 184a and a second metal layer 186a, the second metal liner 184a may be formed by performing a PVD process, and the second metal layer 186a may be selectively formed on the second metal liner 184a by performing a selective deposition process like the second lower metal layer 182 of FIG. 3. Each of the first and second metal liners 174a and 184a may have uneven portions R1 and R2. During the PVD process, the uneven portions R1 and R2 may be formed on external surfaces of the first and second metal liners 174a and 184a by re-sputtering, respectively. Accordingly, adhesion between the first metal liner 174a and the second interlayer insulating layer 192, and between the second metal liner 184a and the second interlayer insulating layer 192 may be enhanced by the uneven portions R1 and R2, respectively.

Figure 5:
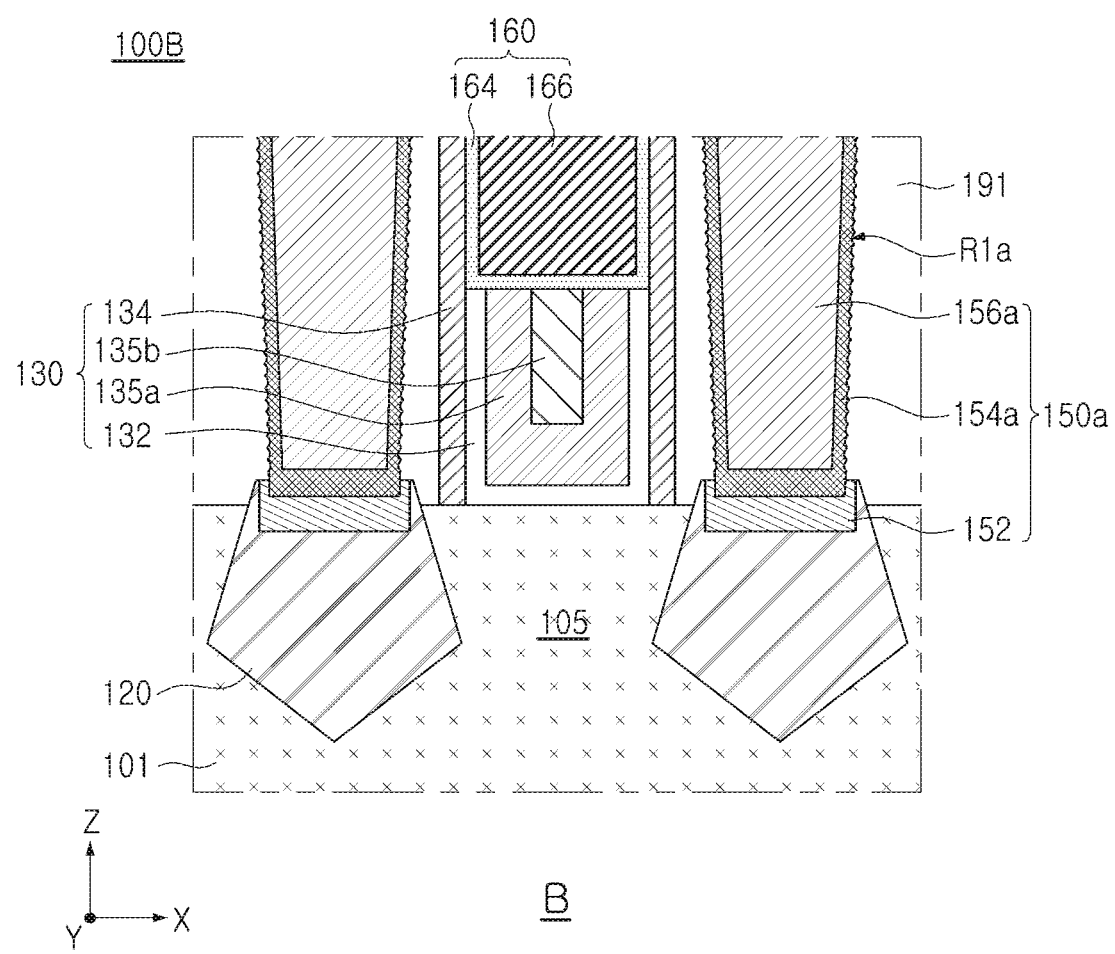
FIGS. 5 through 7 are partially enlarged cross-sectional views illustrating semiconductor devices each according to an example embodiment of the present inventive concept.

FIG. 5 is a partially enlarged cross-sectional view illustrating a semiconductor device according to an example embodiment of the present inventive concept. FIG. 5 illustrates a region corresponding to region "B" of FIG. 2.

Referring to FIG. 5, in a semiconductor device 100B, a first barrier layer 154a of a first contact structure 150a is formed by performing a PVD process, and a first metal plug layer 156a may be formed by performing at least one of a selective deposition process or a CVD process. A barrier metal layer (Ti/TiN) having high resistance may be replaced with the first barrier layer 154a, for example, including tungsten (W), thereby resistance of the first contact structure 150a may be reduced. Similar to the first metal liner 174, the first barrier layer 154a may include surface roughness or a plurality of uneven portions R1a. The uneven portions R1a may contact the first interlayer insulating layer 191. The plurality of uneven portions R1a or the surface roughness may be formed by re-sputtering during a PVD process. Adhesion between the first barrier layer 154a and the first interlayer insulating layer 191 may be enhanced by the plurality of uneven portions R1a or the surface roughness.

Figure 6:
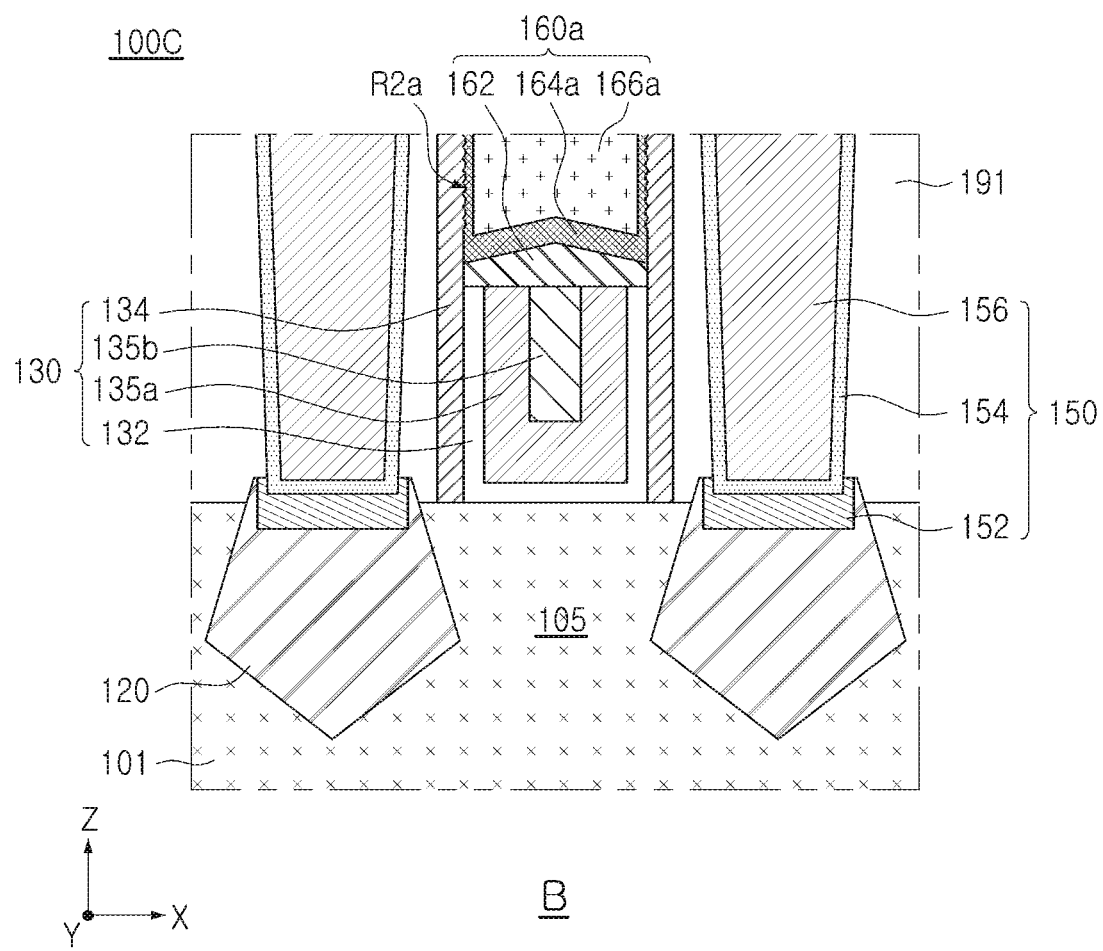

FIG. 6 is a partially enlarged cross-sectional view illustrating a semiconductor device according to an example embodiment of the present inventive concept. FIG. 6 illustrates a region corresponding to region "B" of FIG. 2.

Referring to FIG. 6, in a semiconductor device 100C, a first gate contact structure 160a may include a gate contact metal layer 162, a gate metal plug layer 166a, and a second barrier layer 164a. The gate metal plug layer 166a may be disposed on the gate contact metal layer 162, and the second barrier layer 164a may cover a lower surface and side surfaces of the gate metal plug layer 166a. For example, the first gate contact structure 160a may include a gate contact metal layer 162 and a gate contact plug 164a and 166a on the gate contact metal layer 162, in which the gate contact plug 164a and 166a includes a gate metal plug layer 166a, and a second barrier layer 164a covering a lower surface and side surfaces of the gate metal plug layer 166a. The gate contact metal layer 162 may be formed by performing a selective deposition process and may include tungsten (W). The second barrier layer 164a may be formed by performing a PVD process and may include tungsten (W). The gate metal plug layer 166a may be formed by performing a CVD process and may include a metal, for example, at least one of tungsten (W), ruthenium (Ru), or molybdenum (Mo). The barrier metal layer (Ti/TiN) having high resistance may be replaced with the second barrier layer 164a including tungsten (W), thereby resistance of the first gate contact structure 160a may be reduced. Similar to the second metal liner 184, the second barrier layer 164a may include surface roughness or a plurality of uneven portions R2a. The uneven portions R2a may contact side surfaces of the spacer layers 134. The plurality of uneven portions R2a or the surface roughness may be formed by re-sputtering during a PVD process. Adhesion between the second barrier layer 164a and the spacer layers 134 may be enhanced by the plurality of uneven portions R2a or the surface roughness.

Figure 7:
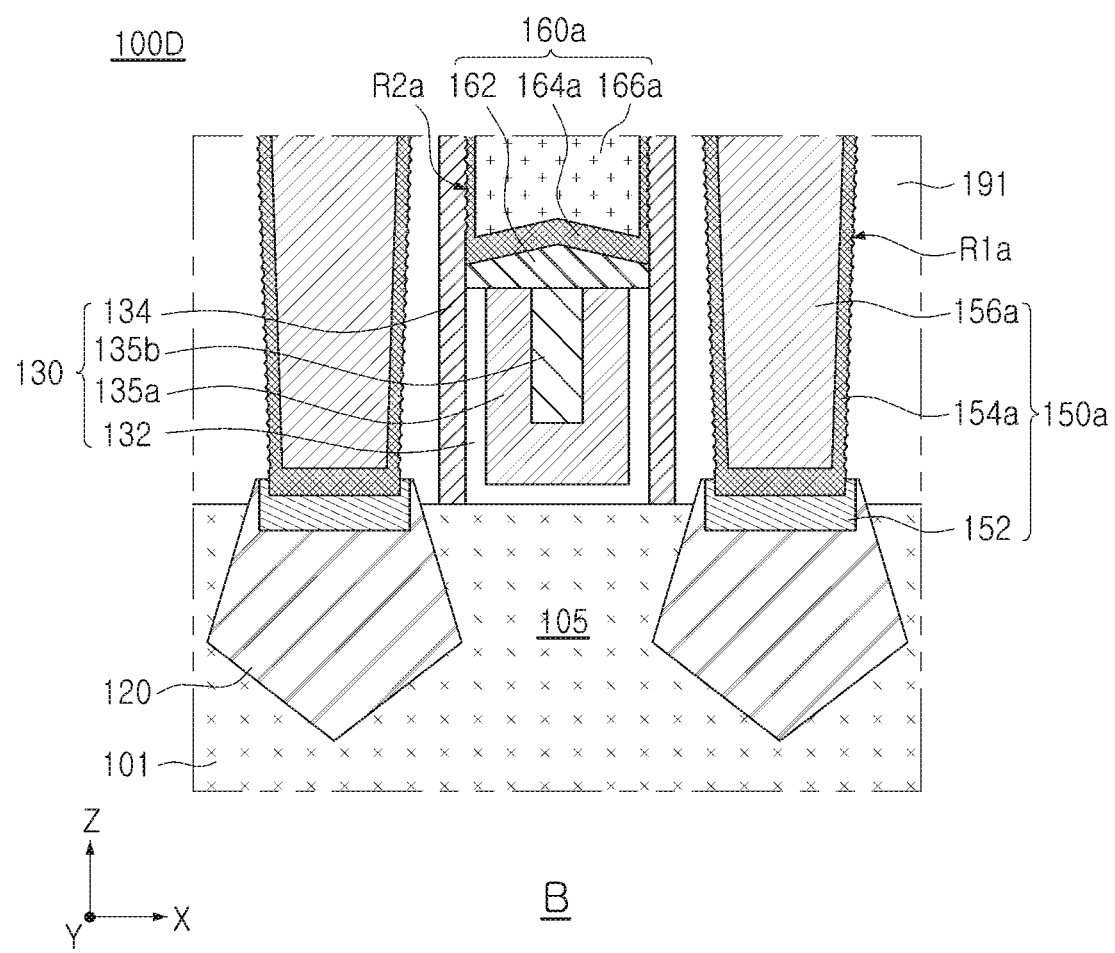

FIG. 7 is a partially enlarged cross-sectional view illustrating a semiconductor device according to an example embodiment of the present inventive concept. FIG. 7 illustrates a region corresponding to region "B" of FIG. 2.

Referring to FIG. 7, a semiconductor device 100D may include the first contact structure 150a of FIG. 5 and the first gate contact structure 160a of FIG. 6. Accordingly, resistance of the first gate contact structure 160a connected to the gate electrodes 135a and 135b may be lowered, and resistance of the first contact structure 150a connected to the source/drain regions 120 may be lowered. Adhesion between the first barrier layer 154a and the first interlayer insulating layer 191 may be enhanced, and adhesion between the second barrier layer 164a and the spacer layers 134 may be enhanced.

FIGS. 8 to 15 are diagrams illustrating a process sequence of a method of manufacturing a semiconductor device according to an example embodiment of the present inventive concept.

Figure 8:
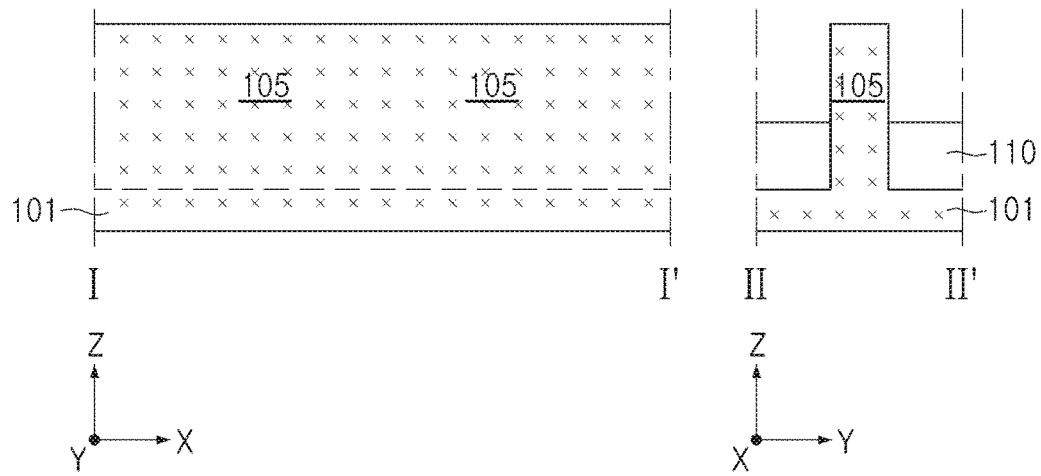
FIGS. 8 through 15 are views illustrating a process sequence of a method of manufacturing a semiconductor device according to an example embodiment of the present inventive concept.

Referring to FIG. 8, an active region 105 may be formed by patterning a substrate 101.

First, the substrate 101 may be patterned to form a trench to define the active region 105 which is a line shape extending in the X direction, the trench may be filled with an insulating material, and part of the insulating material may be removed. Accordingly, a device isolation layer 110 may be formed by making the active region 105 protrude from the substrate 101. An upper surface of the device isolation layer 110 may be formed to be lower than an upper surface of the active region 105.

Figure 9:
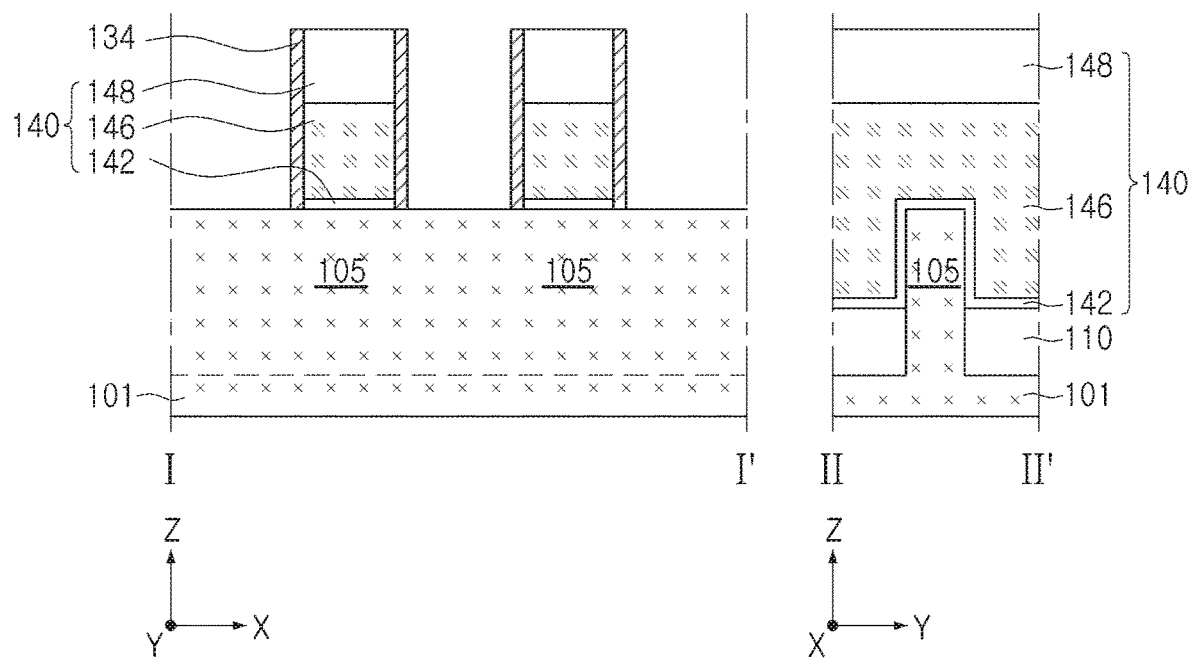

Referring to FIG. 9, a sacrificial gate structure 140 and spacer layers 134 may be formed on the active region 105.

The sacrificial gate structure 140 may be a sacrificial structure formed in a region in which the gate dielectric layer 132 and the gate electrodes 135a and 135b are disposed on the active region 105 as shown in FIG. 2, and may be removed during a subsequent process. The sacrificial gate structure 140 may include first and second sacrificial gate layers 142 and 146 and a mask pattern layer 148 which are sequentially stacked. The first and second sacrificial gate layers 142 and 146 may be patterned using the mask pattern layer 148 as an etching mask. The first and second sacrificial gate layers 142 and 146 may be an insulating layer and a conductive layer, respectively, but the present inventive concept is not limited thereto. For example, the first and second sacrificial gate layers 142 and 146 may be formed as a single layer. For example, the first sacrificial gate layer 142 may include silicon oxide ($SiO_2$), and the second sacrificial gate layer 146 may include polysilicon (p-Si). The mask pattern layer 148 may include silicon oxide ($SiO_2$) and/or silicon nitride ($Si_3N_4$). The sacrificial gate structures 140 may each have a line shape intersecting the active region 105 and extending in one direction. The sacrificial gate structures 140 extend in the Y direction, for example, and may be disposed to be spaced apart from each other in the X direction.

Spacer layers 134 may be formed on both sidewalls of the sacrificial gate structures 140. The spacer layers 134 may be formed by forming a conformal film having a uniform thickness on upper and side surfaces of the sacrificial gate structures 140 and the active region 105 and subsequently performing anisotropic etching. The spacer layers 134 may be formed of at least one of, for example, silicon oxide ($SiO_2$), silicon nitride ($Si_3N_4$), silicon carbonitride (SiCN), silicon oxycarbide (SiOC), silicon oxynitride (SiON), or silicon oxycarbonitride (SiOCN). The spacer layer 134 may be a single layer, or may have a structure in which a plurality of layers are stacked.

Figure 10:
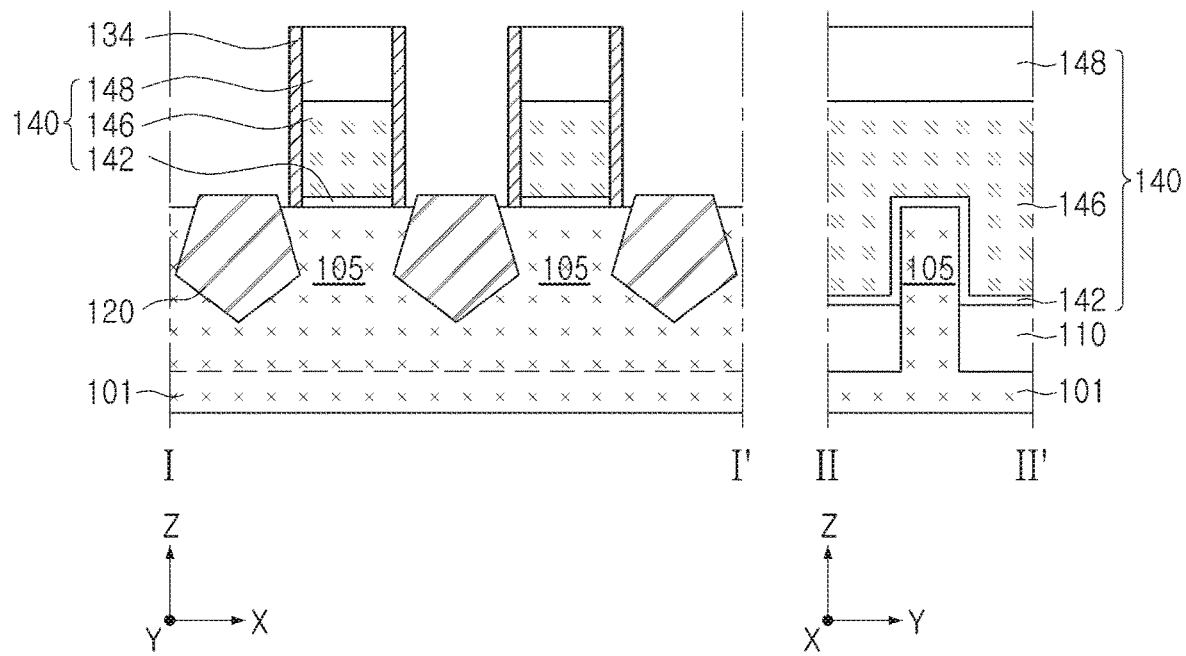

Referring to FIG. 10, source/drain regions 120 may be formed on the active region 105 on both sides of the sacrificial gate structures 140.

The source/drain regions 120 may be formed by performing an epitaxial growth process in the recessed regions of the active region 105 on both sides of the sacrificial gate structures 140. The source/drain regions 120 may include impurities by in-situ doping and may include a plurality of layers having different doping elements and/or different doping concentrations. Although the source/drain regions 120 having a pentagonal shape is illustrate in FIG. 10, the shape of cross sections of the source/drain regions 120 cut along an X-Z plane thereof is not limited thereto, and may have, for example, a circular shape, an oval shape, or a polygonal shape such as a quadrangular shape or a hexagonal shape. Also, different form that illustrated in FIG. 10, instead of forming the source/drain regions 120 in the recessed regions of the active region 105, the source/drain regions 120 may have a raised source/drain (RSD) structure having an upper surface disposed on a level higher than that of an upper surface of the active region 105.

Figure 11:
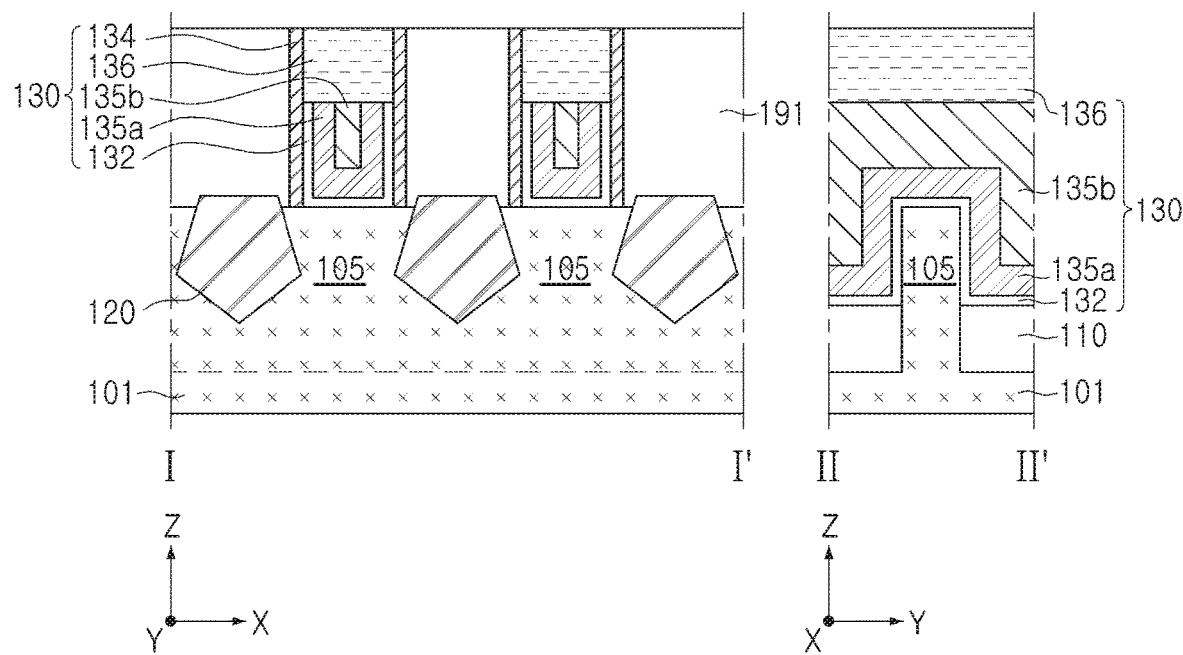

Referring to FIG. 11, a first interlayer insulating layer 191 may be formed on the source/drain regions 120, the sacrificial gate structures 140 may be removed, and the gate structure 130 may be formed.

The first interlayer insulating layer 191 may be partially formed by forming an insulating film covering the sacrificial gate structures 140 and the source/drain regions 120 and performing a planarization process such that an upper surface of a mask pattern layer 148 is exposed. For example, a planarization process, such as a chemical mechanical polishing (CMP) process or an etch back process, may be performed so that the upper surface of the mask pattern layer 148 is exposed.

The sacrificial gate structures 140 may be selectively removed with respect to the spacer layers 134 and the first interlayer insulating layer 191. Removing the sacrificial gate structures 140 may be performed using a dry etching process and/or a wet etching process. As the sacrificial gate structures 140 are removed, a portion of the active region 105 may be exposed between the spacer layers 134.

The gate structure 130 may be formed by forming a gate dielectric layer 132, gate electrodes 135a and 135b, and a gate capping layer 136 in the region from which the sacrificial gate structure 140 is removed. The gate dielectric layer 132 may be formed to conformally cover the upper and side surfaces of the active region 105 and inner walls of the spacer layers 134. After partially removing upper portions of the gate electrodes 135a and 135b to a predetermined depth, the gate capping layer 136 may be formed.

Figure 12:
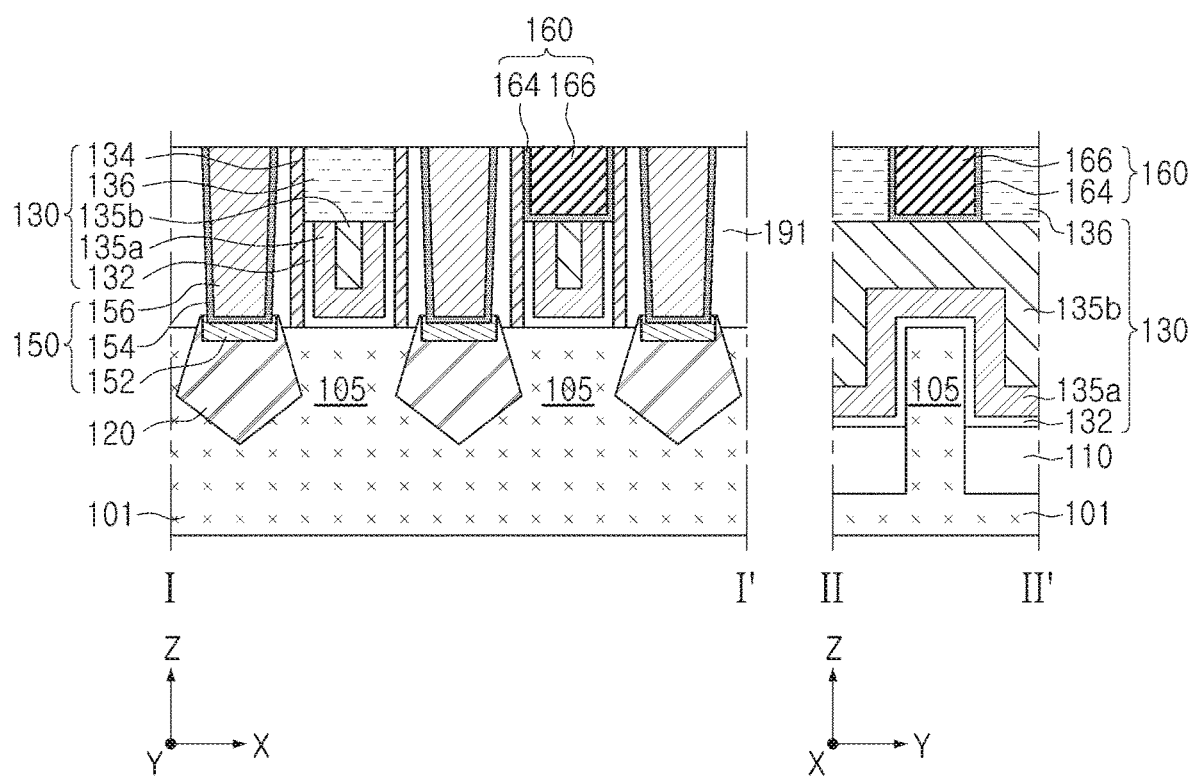

Referring to FIG. 12, between the gate structures 130, a first contact structure 150 penetrating the first interlayer insulating layer 191 may be formed and a first gate contact structure 160 penetrating the gate capping layer 136 may be formed.

First, a contact hole may be formed by patterning the first interlayer insulating layer 191. The contact hole may partially recess the source/drain regions 120. A metal-semiconductor layer 152 may be formed below the contact hole. A metal-semiconductor compound forming the metal-semiconductor layer 152 may be selectively deposited in the contact hole, or the metal-semiconductor layer 152 may be formed by silicidizing or germanizing a portion of a semiconductor material of the source/drain regions 120. For example, after metal layers are deposited on surfaces of the source/drain regions 120, the metal-semiconductor layers 152 may be formed by allowing the metal layers to react with materials of the source/drain regions 120 in this silicidizing or germanizing process.

Next, a first barrier layer 154 and a first metal plug layer 156 may be formed in the contact trench. In an example embodiment of the present inventive concept, to provide the semiconductor device of FIG. 5 or 7, the first barrier layer 154 may be formed by performing a tungsten (W) PVD process, and the first metal plug layer 156 may be formed by performing a CVD process.

Thereafter, a gate contact hole penetrating the gate capping layer 136 may be formed, and a second barrier layer 164 and a second metal plug layer 166 may be formed in the gate contact hole.

Figure 13:
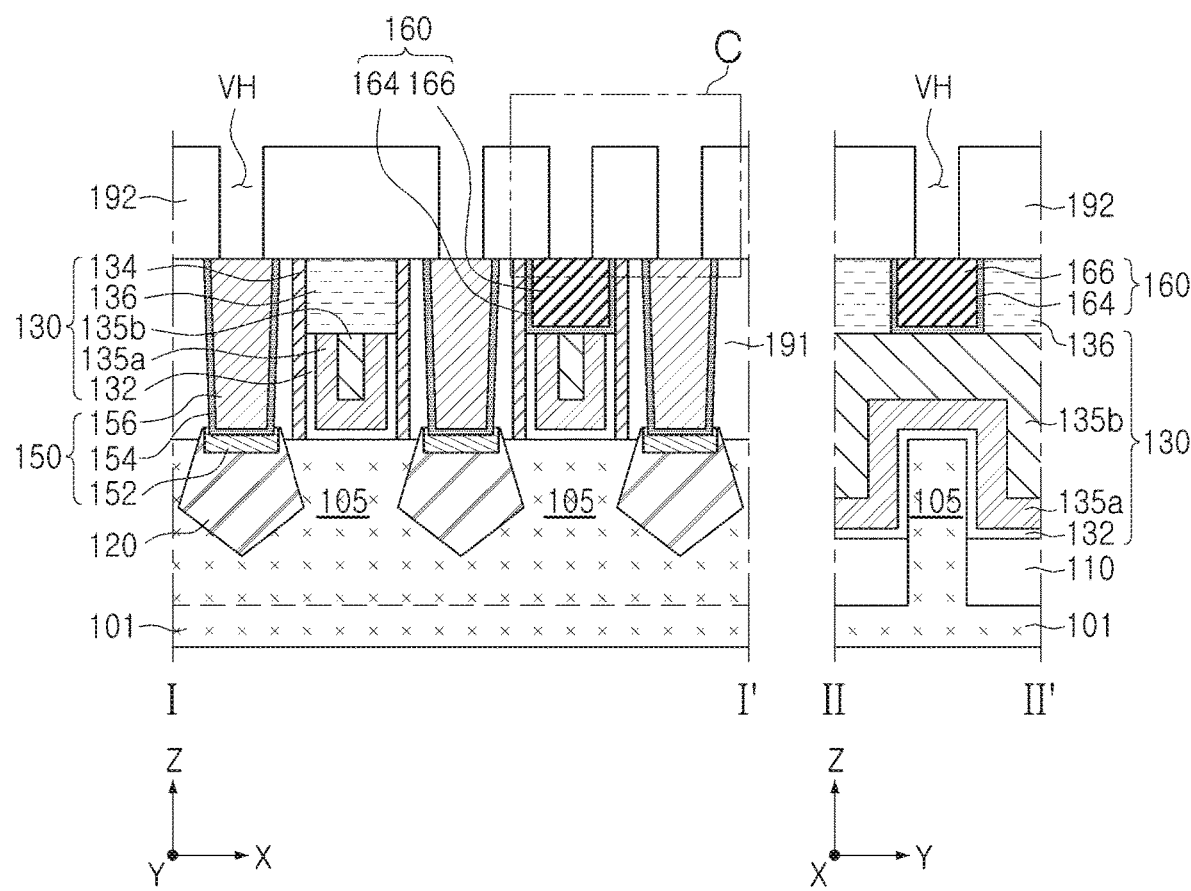

Referring to FIG. 13, a second interlayer insulating layer 192 may be formed on the first interlayer insulating layer 191, and contact holes VH penetrating the second interlayer insulating layer 192 in the Z direction may be formed. The contact holes VH may expose an upper surface of the first contact structure 150 and a portion of the upper surface of the first gate contact structure 160.

FIGS. 14A through 14D illustrate a process of forming a second contact structure 170 and a second gate contact structure 180. FIGS. 14A through 14D are enlarged views of region "C" of FIG. 13.

Figure 14A:
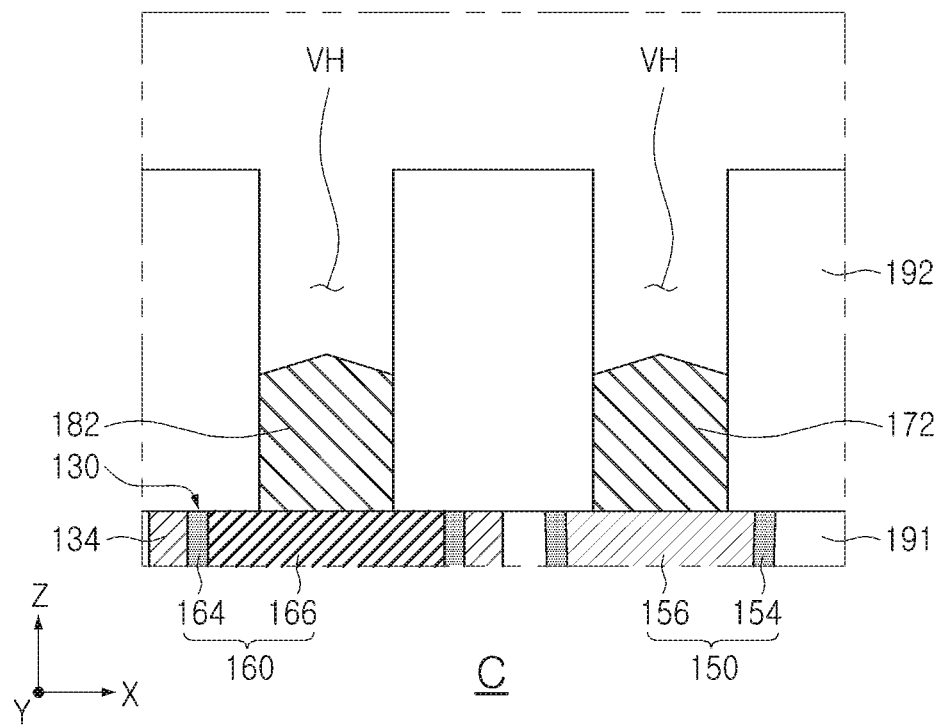

Referring to FIG. 14A, a first lower metal layer 172 and a second lower metal layer 182 may be formed in the contact holes VH respectively on top of the first metal plug layer 156 and the second metal plug layer 166.

The first and second lower metal layers 172 and 182 may be formed by performing a selective deposition process. When performing the selective deposition process, a metal material layer may be deposited on the first metal plug layer 156 and the second metal plug layer 166 including a metal, but may not be formed on the second interlayer insulating layer 192. The first and second lower metal layers 172 and 182 may be formed to have a predetermined thickness from a bottom of the contact holes VH. The upper surfaces of the first and second lower metal layers 172 and 182 may each have a convex shape or an inverted V shape, but the present inventive concept is not limited thereto.

Figure 14B:
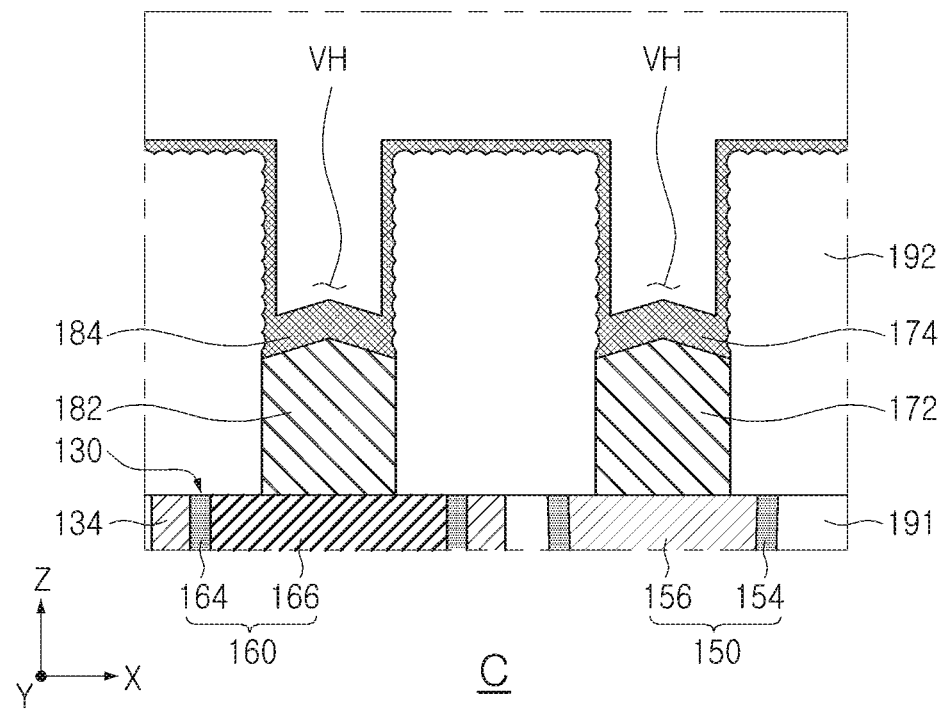

Referring to FIG. 14B, a first metal liner 174 and a second metal liner 184 may be formed on the first and second lower metal layers 172 and 182 in the contact holes VH, respectively.

The first and second metal liners 174 and 184 may be formed by performing a PVD process. During the PVD process, a plurality of uneven portions R1 and R2 may be formed on external surfaces of the first and second metal liners 174 and 184 by re-sputtering, respectively. Accordingly, adhesion between the first metal liner 174 and the second interlayer insulating layer 192, and adhesion between the second metal liner 184 and the second interlayer insulating layer 192 may be enhanced by the uneven portions R1 and R2, respectively. In the case of forming a liner including tungsten (W) by performing a PVD process instead of a barrier metal layer (Ti/TiN) in the contact holes VH, such uneven portions R1 and R2 may be found.

Figure 14C:
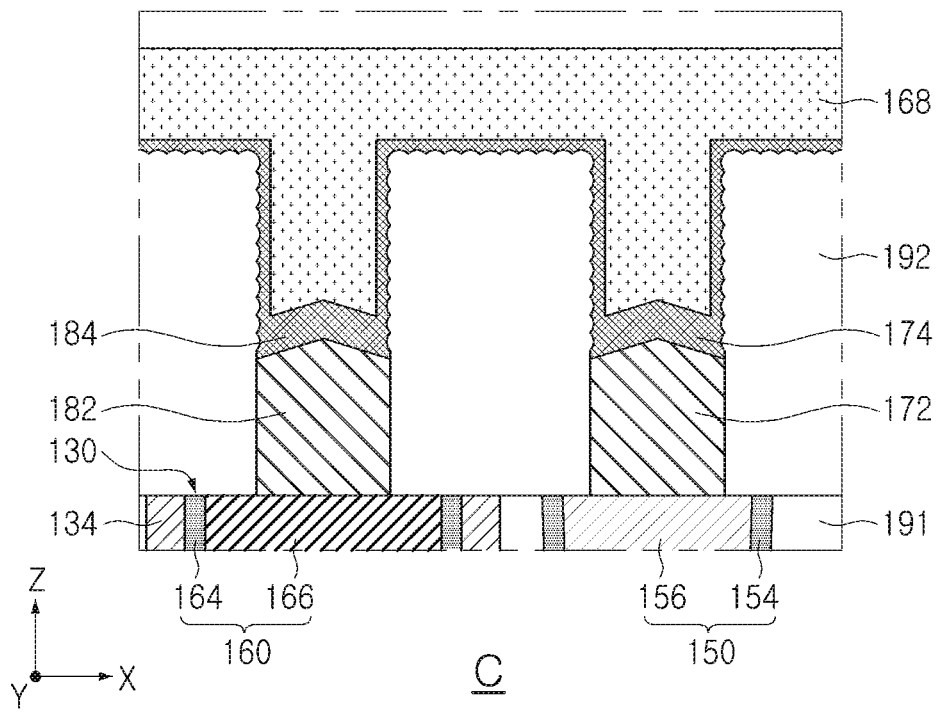

Referring to FIG. 14C, an upper metal layer 168 may be formed.

The upper metal layer 168 may fill a space between inner walls of the first and second metal liners 174 and 184 in the contact holes VH and is formed to extend upward from the second interlayer insulating layer 192. The upper metal layer 168 may be formed by performing a CVD process. During the CVD process, the first and second metal liners 174 and 184 may prevent diffusion of fluorine (F) element.

Figure 14D:
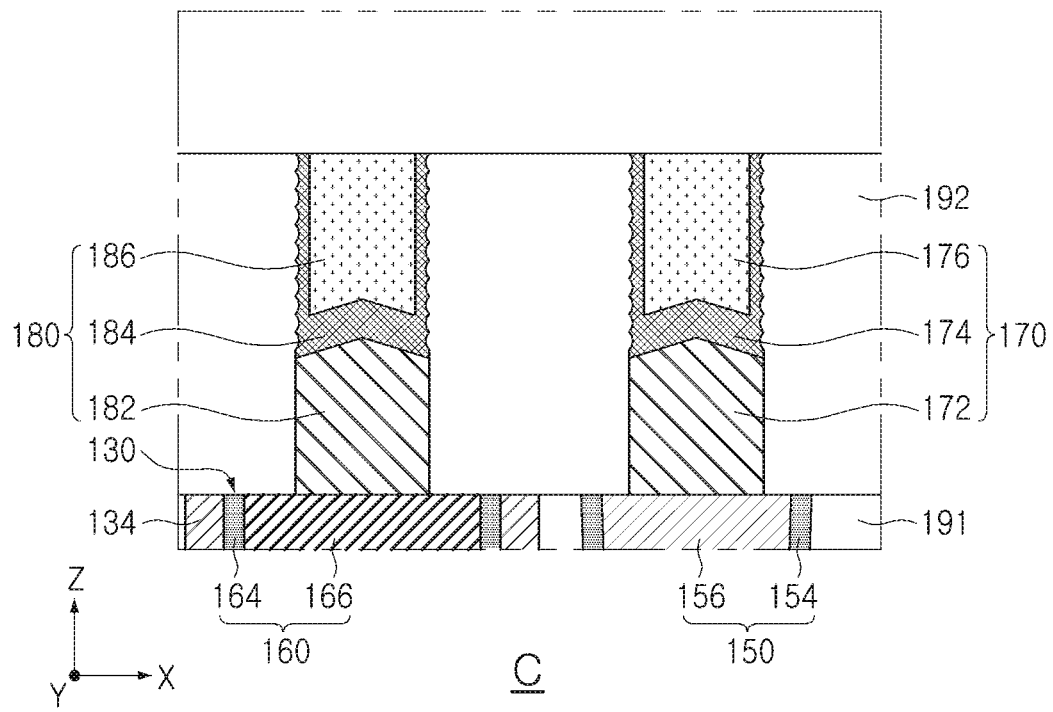

Referring to FIG. 14D, a second contact structure 170 and a second gate contact structure 180 may be formed by performing a planarization process. For example, a planarization process, such as a CMP process or an etch back process, may be performed so that the top surface of the second interlayer insulating layer 192 is exposed.

During the planarization process, the upper metal layer 168 and the first and second metal liners 174 and 184 may be partially removed. Accordingly, the second contact structure 170 including the first lower metal layer 172, the first metal liner 174, and a first upper metal layer 176 may be formed, and the second gate contact structure 180 including the second lower metal layer 182, the second metal liner 184, and a second upper metal layer 186 may be formed.

Figure 15:
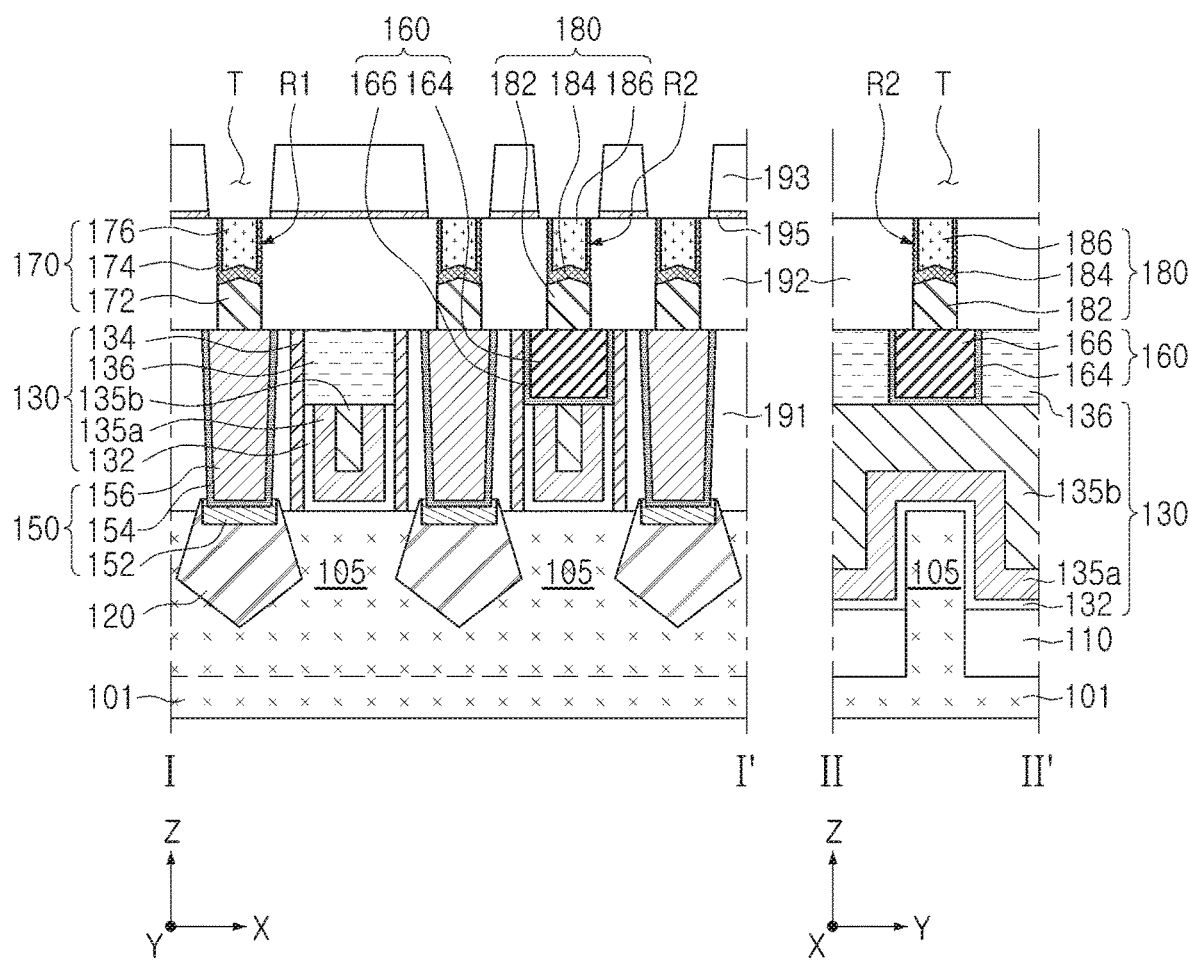

Referring to FIG. 15, an etch stop layer 195 and a third interlayer insulating layer 193 may be formed, and a trench T penetrating the etch stop layer 195 and the third interlayer insulating layer 193 and extending in the Y direction may be formed.

When the trench T is formed, the etch stop layer 195 may serve as a stopper for stopping etching from an upper portion of the second interlayer insulating layer 192. The etch stop layer 195 is also partially removed in the trench T, so that the second contact structure 170 and the second gate contact structure 180 may be partially exposed.

Thereafter, referring to FIG. 2, an upper wiring layer 210 may be formed in the trench T, thus manufacturing the semiconductor device 100.

As described above, the semiconductor device having enhanced electrical characteristics by disposing a metal liner including tungsten (W), instead of a barrier metal layer, in a contact hole may be provided.

While example embodiments have been shown and described above, it will be apparent to those skilled in the art that modifications and variations could be made without departing from the spirit and scope of the present inventive concept as defined by the appended claims.

What is claimed is:

1. A semiconductor device comprising:
    an active region extending in a first direction on a substrate;
    a gate structure extending in a second direction on the substrate, intersecting the active region, and including a gate electrode;
    source/drain region disposed on the active region on at least one side of the gate structure;
    a first contact structure connected to the source/drain region on the at least one side of the gate structure;
    a first gate contact structure disposed on the gate electrode and connected to the gate electrode;
    a second contact structure disposed on the first contact structure and connected to the first contact structure; and
    a second gate contact structure disposed on the first gate contact structure and connected to the first gate contact structure,
    wherein at least one of the second contact structure or the second gate contact structure includes an upper metal layer and a metal liner covering a lower surface and side surfaces of the upper metal layer, and
    wherein an external surface of the metal liner has surface roughness.

2. The semiconductor device of claim 1, wherein the at least one of the second contact structure or the second gate contact structure further includes a lower metal layer disposed below the upper metal layer, and
    wherein the lower metal layer includes tungsten (W).

3. The semiconductor device of claim 2, wherein the upper metal layer includes at least one of tungsten (W), molybdenum (Mo), or ruthenium (Ru), and
    wherein the metal liner includes tungsten (W).

4. The semiconductor device of claim 2, wherein the lower metal layer includes a single crystalline tungsten layer, and
    wherein the metal liner includes a polycrystalline tungsten layer.

5. The semiconductor device of claim 2, wherein the metal liner is in direct contact with the lower metal layer and the upper metal layer.

6. The semiconductor device of claim 1, wherein the lower surface of the upper metal layer includes a concave recess region.

7. The semiconductor device of claim 1, wherein the metal liner has a first thickness in a vertical direction below the upper metal layer and a second thickness in a horizontal direction on a side surface of the upper metal layer, and
    wherein the first thickness is greater than the second thickness.

8. The semiconductor device of claim 1, wherein the first contact structure includes a metal-semiconductor layer disposed in a recess region of the source/drain region and a contact plug on the metal-semiconductor layer, and
    wherein the contact plug includes a metal plug layer and a barrier layer covering a lower surface and side surfaces of the metal plug layer.

9. The semiconductor device of claim 8, wherein the barrier layer includes tungsten (W), and
    wherein an external surface of the barrier layer has surface roughness.

10. The semiconductor device of claim 1, wherein the first gate contact structure includes a gate contact metal layer and a gate contact plug on the gate contact metal layer, and
    wherein the gate contact plug includes a gate metal plug layer, and a barrier layer covering a lower surface and side surfaces of the gate metal plug layer.

11. The semiconductor device of claim 10, wherein the gate metal plug layer and the barrier layer include tungsten (W), and
    wherein an external surface of the barrier layer has surface roughness.

12. A semiconductor device comprising:
    an active region extending in a first direction on a substrate;
    a gate structure intersecting the active region on the substrate and extending in a second direction;

source/drain region disposed on the active region on at least one side of the gate structure;

a first contact structure connected to the source/drain region on the at least one side of the gate structure; and a second contact structure disposed on the first contact structure and connected to the first contact structure, wherein the second contact structure includes a first upper metal layer and a first metal liner covering a lower surface and side surfaces of the first upper metal layer, wherein the lower surface of the first upper metal layer does not have rough surface and has a concave shape or an inverted V shape, and wherein an external surface of the first metal liner includes a plurality of uneven portions.

13. The semiconductor device of claim 12, wherein the first upper metal layer includes at least one of tungsten (W), molybdenum (Mo), or ruthenium (Ru).

14. The semiconductor device of claim 12, wherein the second contact structure further includes a first lower metal layer disposed between the first metal liner and the first contact structure, and wherein each of the first lower metal layer and the first metal liner includes tungsten (W).

15. The semiconductor device of claim 12, wherein a first width of an upper portion of the first contact structure is greater than a second width of a lower portion of the second contact structure.

16. The semiconductor device of claim 12, wherein a concentration of fluorine (F) element included in the first metal liner is smaller than a concentration of fluorine (F) element included in the first upper metal layer.

17. The semiconductor device of claim 12, wherein
the gate structure includes:
a gate electrode;
a gate dielectric layer disposed between the active region and the gate electrode;
spacer layers disposed on both sides of the gate electrode; and
a gate capping layer covering an upper surface of the gate electrode between the spacer layers, and
the semiconductor device further includes:

a first gate contact structure being in contact with the gate electrode and penetrating through the gate capping layer; and a second gate contact structure being in contact with the first gate contact structure on the first gate contact structure.

18. The semiconductor device of claim 17, wherein the second gate contact structure includes a second lower metal layer, a second upper metal layer on the second lower metal layer, and a second metal liner covering a lower surface and side surfaces of the second upper metal layer, and wherein an external surface of the second metal liner includes a plurality of uneven portions.

19. A semiconductor device comprising:

a first interlayer insulating layer and a second interlayer insulating layer sequentially disposed on a substrate;

a first contact structure penetrating the first interlayer insulating layer on the substrate;

a second contact structure penetrating the second interlayer insulating layer and contacting an upper portion of the first contact structure; and a metal wiring contacting an upper portion of the second contact structure and extending in a first direction, wherein the first contact structure includes a metal plug layer and a barrier layer covering a lower surface and side surfaces of the metal plug layer, wherein the second contact structure includes an upper metal layer and a metal liner covering a lower surface and side surfaces of the upper metal layer, wherein the lower surface of the upper metal layer does not have rough surface and has a concave shape or an inverted V shape, and wherein a side surface of the second interlayer insulating layer in contact with the metal liner has surface roughness.

20. The semiconductor device of claim 19, wherein the metal liner includes a plurality of uneven portions corresponding to the surface roughness of the second interlayer insulating layer.

* * * * *